United States Patent [19]
Okubo et al.

[11] Patent Number: 5,264,807
[45] Date of Patent: Nov. 23, 1993

[54] HIGH FREQUENCY POWER AMPLIFIER WITH HIGH EFFICIENCY AND LOW DISTORTION

[75] Inventors: Naofumi Okubo, Kawasaki; Yoshihiko Asano, Tokyo; Hiroshi Kurihara, Tokyo; Yoshimasa Daido, Yokohama; Kazuhiko Kobayashi, Kawasaki; Shuji Kobayakawa, Yokohama; Toru Maniwa, Kawasaki, all of Japan

[73] Assignee: Fujitsu Limited, Kawasaki, Japan

[21] Appl. No.: 744,435

[22] Filed: Aug. 13, 1991

[30] Foreign Application Priority Data

Aug. 13, 1990 [JP] Japan .................. 2-211517

[51] Int. Cl.$^5$ .............................. H03F 3/68
[52] U.S. Cl. ..................... 330/295; 330/269; 330/124 R; 330/149
[58] Field of Search ............. 330/10, 84, 122, 124 R, 330/149, 262, 264, 295, 269

[56] References Cited

U.S. PATENT DOCUMENTS

| | | |
|---|---|---|
| 3,789,314 | 1/1974 | Beurrier ............... 330/185 |
| 3,927,379 | 12/1975 | Cox et al. ............. 330/10 |
| 4,433,312 | 2/1984 | Kahn ................... 332/145 |
| 4,455,536 | 6/1984 | Stegens ................ 330/286 |
| 4,701,716 | 10/1987 | Poole .................. 330/43 |

FOREIGN PATENT DOCUMENTS 1-206709 8/1989 Japan .

*Primary Examiner*—James B. Mullins
*Attorney, Agent, or Firm*—Staas & Halsey

[57] ABSTRACT

A high frequency amplifier containing: a constant envelope signal generation circuit for transforming an input signal to form two constant envelope signals where phases of the constant envelope signals correspond to an amplitude of an envelope of the input signal; two amplifying circuits for separately amplifying two constant envelope signals; and a power synthesizing circuit for synthesizing the first and second amplified signals to generate an amplified signal of the input electric signal, and reflecting remaining components of the first and second amplified signals which remaining components remain in the above synthesizing operation, toward the first and second amplifying circuits. Further, an input impedance of the power synthesizing circuit may be controlled by shifting phases of the above reflected components by respectively predetermined amounts, or by adaptively shifting phases of the above reflected components responding to an input level, so that a total efficiency of the high frequency amplifier is maximized. The high frequency amplifier may contain, instead of the above two amplifying circuits and the power synthesizing circuit, a circuit for inverting a phase of one of the two constant envelope signals; and a single-ended push-pull amplifier circuit for receiving the other of the two constant envelope signals, and an output of the phase inversion circuit, and synthesizing the received signals to generate an amplified signal of the input electric signal.

10 Claims, 6 Drawing Sheets

ORIGINAL INPUT SIGNAL

DECOMPOSITION TO TWO CONSTANT ENVELOPE SIGNALS

HIGH FREQUENCY POWER AMPLIFIER WITH HIGH EFFICIENCY AND LOW DISTORTION

BACKGROUND OF THE INVENTION (1) Field of the Invention

The present invention relates to a high frequency (microwave) power amplifier for use in radio communication apparatuses in mobile radio communication systems, in multiplex radio communication systems, in satellite radio communication systems, and in broadcasting systems.

(2) Description of the Related Art

Conventionally, various microwave amplifiers are provided For example, a class "A" amplifier is suitable for a low distortion amplification, but a theoretical linear efficiency thereof is low (50%). This efficiency is improved to up to 78.5% in a class "B" amplifier, and the efficiency in a low power input in the class "B" amplifier is better than that of the class "A" amplifier, since the power consumption varies with an amount of power input. Nevertheless, the distortion is large when the power input is low. A class "C" amplifier can realize a 100% efficiency, but has an extremely poor distortion characteristic. Therefore, the class "C" amplifier is not suitable for an amplification of an electric signal wherein an envelope of a level of the electric signal varies, as in the case of a linear modulation system or a multi-carrier amplification system.

To constantly operate an amplifier, regardless of its power input level, with the same efficiency as that obtained when an amplification device in the amplifier is in a saturated condition, the amplification device must be always in the saturated condition, but this condition is contradictory to the linear amplification operation of the amplification device. In the prior art, the LINC system has been proposed as a way of solving this problem. The LINC system was proposed by D. C. Cox of the Bell laboratories ("Linear Amplification with Nonlinear Components", IEEE Transactions on Communications, COM-22, pp. 1942 to 1945, December 1974), and an application of the LINC system is proposed by Shigeru Tomisato et al. of the Nippon Telegraph and Telephone corporation ("Phase-Error Compensated LINC Modulator" reported in the autumn meeting of the Institute of Electronics, Information, and Communication Engineers in Japan, 1989). In the LINC system, a linear amplification of an electric signal with a high efficiency and without distortion can be obtained because a linear amplification can be realized using a non-linear amplifier, for example, the class "C" amplifier. The LINC system is explained below.

In the LINC system, an electric signal which has an envelope, and which is to be amplified, is decomposed to form two electric signals both having an equal and constant envelope, the decomposed signals are separately amplified by two respective amplifiers, and an amplified signal of the above electric signal is composed from the outputs of the amplifiers in a 90° hybrid circuit.

Since, in the LINC system, the signals which are to be amplified each have a constant envelope, amplifiers with a high efficiency, for example, a class "C" amplifier, can be used for the amplification of the signals, and an original signal can be composed of the amplified signals. Namely, a linear amplification of an electric signal with an improved efficiency and without distortion is achieved because a linear amplification can be realized.

In the LINC system, however, the electric signals which are amplified in the above amplifiers have a constant envelope regardless of the power level of an input signal to the LINC system, and therefore, a constant power is consumed in each of the amplifiers regardless of the power level of an input signal. For example, the constant power is consumed in each of the amplifiers even when the power input is zero.

FIGS. 1A and 1B are diagrams for explaining a transformation of an input signal to form two electric signals each having a constant envelope, in the LINC system.

In the LINC system, a level of an envelope of an input signal is transformed to phases of the signals having a constant envelope, the transformed signals are separately amplified, and then the amplified signals are vector synthesized to generate an amplified signal of the input signal. As indicated in FIGS. 1A and 1B, an arbitrary input signal A having an amplitude of not more than two is decomposed to form two signals B and C, where the amplitudes of the signals B and C are made equal to one by equalizing the angle (phase) between the signal A and the transformed signal B, and the angle (phase) between the signal A and the transformed signal C. Generally, amplification devices operate most efficiently in the region near their saturated points, and the above transformed signals have a constant amplitude, the amplifiers (amplification devices) can be operated in the saturated region (non-linear region). The linearly amplified signal of the input signal A is obtained by vector synthesizing the amplified signals of the transformed signals B and C.

FIG. 2 is a diagram of a construction of the LINC system. In FIG. 2, reference numeral 21 denotes a constant envelope signal generation circuit which transforms an input signal to form two signals having a constant envelope and phases corresponding to an amplitude of the input signal; 22 and 23 each denote an amplifier which separately amplifies the transformed signals in their saturated regions; and 26 denotes a 90° hybrid circuit. The outputs of the amplifiers 22 and 23 are input to two adjacent terminals of the 90° hybrid circuit 26, and the above vector synthesized signal is obtained from one of the other terminals of the 90° hybrid circuit 26. A dummy resistor 50 is connected to the last terminal of the 90° hybrid circuit 26 and the earth. As shown in FIG. 2, in the LINC system, the power difference between a sum of the powers of the two transformed and amplified signals and the power of the synthesized signal, which difference corresponds to an unnecessary component, is transformed to heat in the dummy resistor 50.

A total efficiency η of the LINC system is expressed as below.

$$\eta t = Po\eta/2Pc$$

where Pc denotes the sum of powers of the transformed signals (constant envelope signals), η is an efficiency of the amplifiers in the saturated condition, and Po denotes the power of the synthesized signal (the output of the LINC system). In the above system, the amplification devices are always saturated, and consume a constant power, and therefore, the total efficiency is proportional to the output power Pc of the system. Namely, the linearity of the amplification in the LINC system is improved, but the efficiency is not greatly improved.

The efficiency is low when a difference between a peak power and an average power of an input signal is large because the power difference between a sum of the powers of the two transformed and amplified signals and the power of the output (synthesized) signal is consumed through the dummy resistor 50.

FIG. 3 is a diagram showing the efficiencies of an ideal class "A" amplifier, ideal class "B" amplifier, the LINC system containing amplifiers having an 100% efficiency, and constructions of various aspects of the present invention, which are explained later, for various values of relative output power. The efficiencies in the ideal class "A" amplifier and the LINC system are reduced in proportional to the output power, and the efficiency in the ideal class "B" amplifier is reduced in proportion to a square root of the output power.

SUMMARY OF THE INVENTION

An object of the present invention is to provide a high frequency amplifier for amplifying a high frequency electric signal, where a distortion in linearity, and a reduction in efficiency when an input power is low, are small.

According to the first aspect of the present invention, there is provided a high frequency amplifier comprising: a constant envelope signal generation circuit for receiving an input electric signal, and transforming the electric signal to form two constant envelope signals where amplitudes of envelopes of the constant envelope signals are constant, and phases of the constant envelope signals correspond to an amplitude of an envelope of the input electric signal; first and second amplifying circuits for respectively receiving the two constant envelope signals, and amplifying the constant envelope signals, separately, to respectively generate first and second amplified signals; and a power synthesizing circuit for synthesizing the first and second amplified signals to generate an amplified signal of the input electric signal, and reflecting remaining components of the first and second amplified signals, which remaining components remain in the above synthesizing operation, toward the first and second amplifying circuits. The power synthesizing circuit may have one output terminal, two input terminals, and two electric signal paths respectively connecting the two input terminals to the output terminal. The first and second amplifying circuits each comprises an amplification device, and a propagation length of an electric signal from an output terminal of each amplification device to the output terminal of the power synthesizing circuit may be equal to $(2n-1)\lambda/4$, where $n=1, 2, \ldots$ where $2\pi/\lambda$ is an amplification frequency.

According to the second aspect of the present invention, there is provided a high frequency amplifier comprising: a constant envelope signal generation circuit for receiving an input electric signal, and transforming the electric signal to form first and second constant envelope signals where amplitudes of envelopes of the first and second constant envelope signals are constant, and phases of the first and second constant envelope signals correspond to an amplitude of an envelope of the input electric signal; a phase shift circuit for shifting a phase of the first constant envelope signal by 90 degrees; a first amplifying circuit for receiving and amplifying the first constant envelope signal after the phase of the first constant envelope signal has been shifted by 90 degrees, to generate a first amplified signal; a second amplifying circuit for receiving and amplifying the second constant envelope signal, to generate a second amplified signal; and a 90° hybrid circuit, having first, second, third, and fourth terminals, for receiving the first and second amplified signals at the first and second terminals of thereof, respectively, and synthesizing the first and second amplified signals to generate an amplified signal of the input electric signal, where a propagation length of a first signal path from the second terminal to the third terminal, and a propagation length of a second signal path from the second terminal to the third terminal, are made such that a sum of the phase shift caused by the phase shift circuit and a phase shift caused in the first signal path from the first terminal to the third terminal is equal to a phase shift caused in the second signal path from the second terminal to the third terminal, the amplified signal of the input electric signal is output from the third terminal, and the fourth terminal is made electrically open.

According to the third aspect of the present invention, there is provided a high frequency amplifier comprising: a constant envelope signal generation circuit for receiving an input electric signal, and transforming the electric signal to form first and second constant envelope signals where amplitudes of envelopes of the first and second constant envelope signals are constant, and phases of the first and second constant envelope signals correspond to an amplitude of an envelope of the input electric signal; a phase shift circuit for shifting a phase of the first constant envelope signal by 180 degrees; a first amplifying circuit for receiving and amplifying the first constant envelope signal after the phase of the first constant envelope signal has been shifted by 180 degrees, to generate a first amplified signal; a second amplifying circuit for receiving and amplifying the second constant envelope signal, to generate a second amplified signal; and a 180° hybrid circuit, having first, second, third, and fourth terminals, for receiving the first and second amplified signals at the first and second terminals of thereof, respectively, and synthesizing the first and second amplified signals to generate an amplified signal of the input electric signal, where a propagation length of a first signal path from the second terminal to the third terminal, and a propagation length of a second signal path from the second terminal to the third terminal, are made such that a sum of the phase shift caused by the phase shift circuit and a phase shift caused in the first signal path from the first terminal to the third terminal is equal to a phase shift caused in the second signal path from the second terminal to the third terminal, the amplified signal of the input electric signal is output from the third terminal, and the fourth terminal is made electrically open.

In the above first to third aspects of the present invention, the first and second amplifying circuits are each one of a class "AB" amplifier, a class "B" amplifier, a class "C" amplifier, and a class "F" amplifier, wherein an input current thereof varies depending upon an input power thereof.

According to the fourth aspect of the present invention, there is provided a high frequency amplifier comprising: a constant envelope signal generation circuit for receiving an input electric signal, and transforming the electric signal to form two constant envelope signals where amplitudes of envelopes of the constant envelope signals are constant, and phases of the constant envelope signals correspond to an amplitude of an envelope of the input electric signal; first and second amplifying circuits for respectively receiving the two constant envelope signals, and amplifying the constant envelope signals, separately, to respectively generate first and second amplified signals; and a first circulator, provided corresponding to the first amplifying circuits, having first, second, and third terminals, the first terminal is connected to an output terminal of the first amplifying circuit; a second circulator, provided corresponding to the second amplifying circuits, having second, second, and third terminals, the second terminal is connected to an output terminal of the second amplifying circuit; in each of the first and second circulators, an input signal from the first terminal being output from the second terminal, an input signal from the second terminal being output from the third terminal, and an input signal from the third terminal being output from the first terminal; a power synthesizing circuit for receiving the first and second amplified signals from the second terminals of the first and second circulators, synthesizing the received signals to generate an amplified signal of the input electric signal, and reflecting remaining components of the above first and second amplified signals which remaining components remain in the above synthesizing operation, toward the second terminals of the first and second circulators; a propagation length of an electric signal from an output terminal of each of the first and second circulators to the output terminal synthesizing circuit is equal to $(2n-1)\lambda/4$, where $n=1, 2, \ldots$, and $2\pi/\lambda$ is an amplification frequency; a first phase shift circuit connected to the third terminals of the first circulator, for receiving an electric signal which is output from the third terminal, shifting a phase of the received electric signal, and inputting the phase-shifted signal into the third terminal; and a second phase shift circuit connected to the third terminals of the second circulator, for receiving an electric signal which is output from the third terminal, shifting a phase of the received electric signal, and inputting the phase-shifted signal into the third terminal.

In the above fourth aspect of the present invention, the absolute values of the phase shifts in the first and second phase shift circuit are equal, and the polarity of the phase shift in the first phase shift circuit is opposite to that in the second phase shift circuit.

According to the fifth aspect of the present invention, there is provided a high frequency amplifier comprising: a constant envelope signal generation circuit for receiving an input electric signal, and transforming the electric signal to form two constant envelope signals where amplitudes of envelopes of the constant envelope signals are constant, and phases of the constant envelope signals correspond to an amplitude of an envelope of the input electric signal; and first and second amplifying circuits for respectively receiving the two constant envelope signals, and amplifying the constant envelope signals, separately, to respectively generate first and second amplified signals; and a power synthesizing circuit for receiving the first and second amplified signals, and synthesizing the received signals to generate an amplified signal of the input electric signal; the power synthesizing circuit comprising a circuit for adaptively varying a real part of an input impedance of the power synthesizing circuit responding to an amplitude of an envelope of the input electric signal so that the real part becomes large when an output power is small, and the real part becomes small when an output power is large.

In the above fifth aspect of the present invention, the power synthesizing circuit comprises; an input power level detecting circuit for detecting a power level of the input electric signal; a first circulator, provided corresponding to the first amplifying circuits, having first, second, and third terminals, the first terminal is connected to an output terminal of the first amplifying circuit; a second circulator, provided corresponding to the second amplifying circuits, having first, second, and third terminals, the first terminal is connected to an output terminal of the second amplifying circuit; in each of the first and second circulators, an input signal from the first terminal being output from the second terminal, an input signal from the second terminal being output from the third terminal, and an input signal from the third terminal being output from the first terminal; a branch circuit for receiving the first and second amplified signals from the second terminals of the first and second circulators, synthesizing the received signals to generate an amplified signal of the input electric signal, and reflecting remaining components of the first and second amplified signals which remaining components remain in the above synthesizing operation, toward the second terminals of the first and second circulators; a propagation length of an electric signal from an output terminal of each of the first and second circulators to the output terminal of the branch circuit is equal to $(2n-1)\lambda/4$, where $n=1, 2, \ldots$, and $2\lambda/\pi$ is an amplification frequency; a first phase shift circuit connected to the third terminals of the first circulator, for receiving an electric signal which is output from the third terminal, shifting a phase of the received electric signal, and inputting the phase-shifted signal into the third terminal; and a second phase shift circuit connected to the third terminals of the second circulator, for receiving an electric signal which is output from the third terminal, shifting a phase of the received electric signal, and inputting the phase-shifted signal into the third terminal; the branch circuit comprising a circuit for adaptively varying a real part of an input impedance of the power synthesizing circuit responding to a detected result of the input power level detecting circuit so that the real part is maintained equal to zero.

According to the sixth aspect of the present invention, there is provided a high frequency amplifier comprising: a constant envelope signal generation circuit for receiving an input electric signal, and transforming the electric signal to form two constant envelope signals where amplitudes of envelopes of the constant envelope signals are constant, and phases of the constant envelope signals correspond to an amplitude of an envelope of the input electric signal; a phase inversion circuit for inverting a phase of one of the two constant envelope signals; and a single-ended push-pull amplifier circuit for receiving the other of the two constant envelope signals, and an output of the phase inversion circuit, and synthesizing the received signals to generate an amplified signal of the input electric signal.

In the above sixth aspect of the present invention, the single-ended push-pull amplifier circuit comprises first and second amplifying devices being serially connected, and the first and second amplifying devices are each one of a class "AB" amplifier, a class "B" amplifier, and a class "C" amplifier, wherein an input current thereof varies depending upon an input power thereof.

DESCRIPTION OF THE PREFERRED EMBODIMENTS

Basic Operations

Figure 1A:
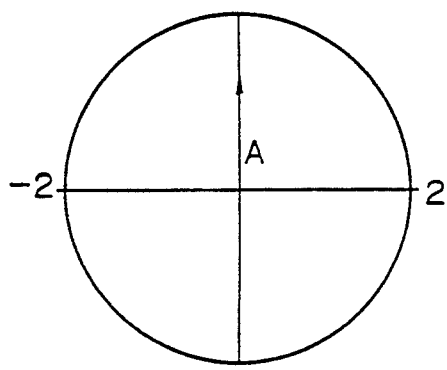
FIGS. 1A and 1B are diagrams for explaining a transformation of an input signal to two electric signals each having a constant envelope, in the LINC system.

Before describing the preferred embodiment of the present invention, first, the basic operations of the first to sixth aspects of the present invention are explained below.

According to the first aspect of the present invention, the above-mentioned remaining components which remain in the synthesizing operation by the power synthesizing circuit (which are unnecessary to the synthesizing operation), are reflected toward the amplifying circuits, and therefore, the total efficiency of the high frequency amplifier is improved compared with the conventional LINC system in which the remaining components are consumed as a heat in the dummy resistor. The low distortion characteristic of the LINC system is maintained in the high frequency amplifier according to the first aspect of the present invention.

Similar to the above, remaining components of the amplified constant envelope signals, which components remain in the synthesizing operation by the 90° hybrid circuit, are reflected toward the amplifying circuits in the 90° hybrid circuit in the second aspect of the present invention, and remaining components of the amplified constant envelope signals which components remain in the synthesizing operation by the 180° hybrid circuit, are reflected toward the amplifying circuits in the 180° hybrid circuit in the third aspect of the present invention.

According to the fourth aspect of the present invention, a propagation length of a signal from the output terminal of the power synthesizing circuit to the output terminal of the amplification device in each amplifying circuits, is made different from a propagation length of a signal from the output terminal of the amplification device in the amplifying circuit to the output terminal of the power synthesizing circuit, by the provision of the first and second phase shifting circuits. As explained later, it is possible to increase points at which an imaginary part of a load impedance of the amplification device becomes equal to zero within a range of an input electric signal, and thus it is possible to decrease a loss due to a reactive power. Namely, the total efficiency can be improved.

According to the fifth aspect of the present invention, the propagation length of a signal from the output terminal of the power synthesizing circuit to the output terminal of the amplification device in each amplifying circuit, is adaptively varied responding to the amplitude of the envelope of the input electric signal so that a real part of a load impedance of the amplification device is adaptively varied within a range of an input electric signal. The real part is made large when the output power is large, and the real part is made small when the output power is small. Thus, the total efficiency of the high frequency amplifier can be improved even when the input power is low.

In the construction according to the sixth aspect of the present invention, a signal which is input from one input terminal of the single-ended push-pull amplifier circuit is phase inverted and amplified to be output from the output terminal of the single-ended push-pull amplifier circuit, and a signal which is input from the other input terminal of the single-ended push-pull amplifier circuit is not inverted but is amplified to be output from the output terminal of the single-ended push-pull amplifier circuit. Since one of the two constant envelope signals is phase inverted in the phase inversion circuit, and is then applied the input terminal of the single-ended push-pull amplifier circuit, and the other constant envelope signal is applied, without being inverted, to the other input terminal of the single-ended push-pull amplifier circuit, then the sum of signal components in phase of the amplified constant envelope signals is obtained from the output of the single-ended push-pull amplifier circuit.

Figure 4:
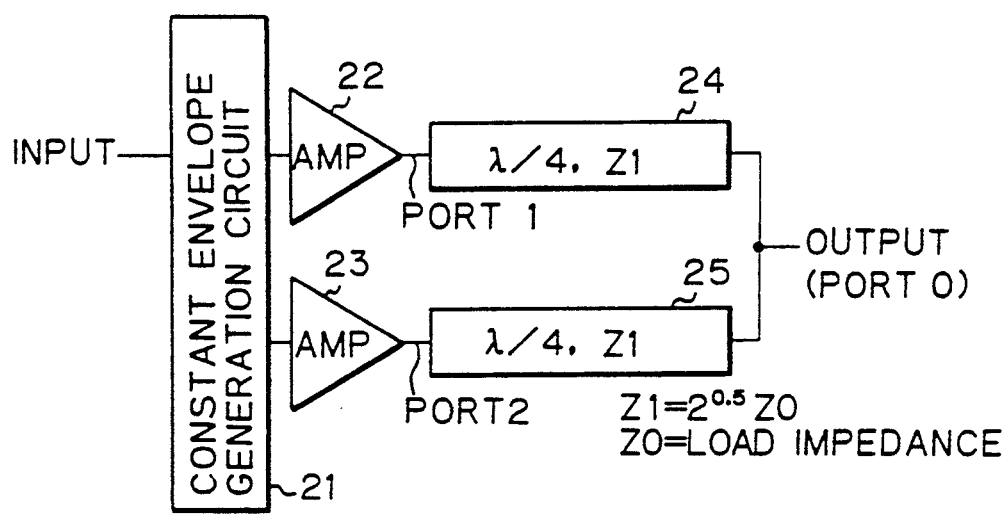
FIG. 4 is a diagram indicating a construction of a high frequency amplifier according to the first embodiment of the present invention.

FIG. 4 (First Embodiment)

FIG. 4 is a diagram indicating a construction of a high frequency amplifier according to the first embodiment of the present invention. In FIG. 4, reference numeral 21 denotes a constant envelope signal generation circuit, 22 and 23 each denote an amplifying circuit, and 24 and 25 each denote a strip line, where λ is a wavelength of a carrier wave.

Figure 1B:
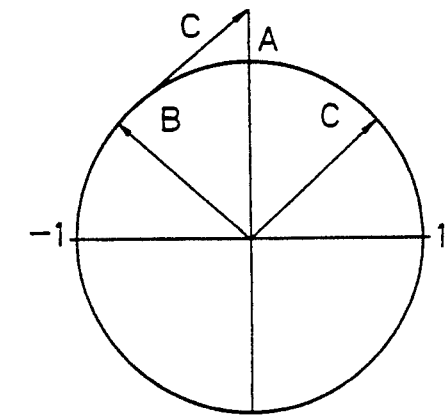
Figure 2:
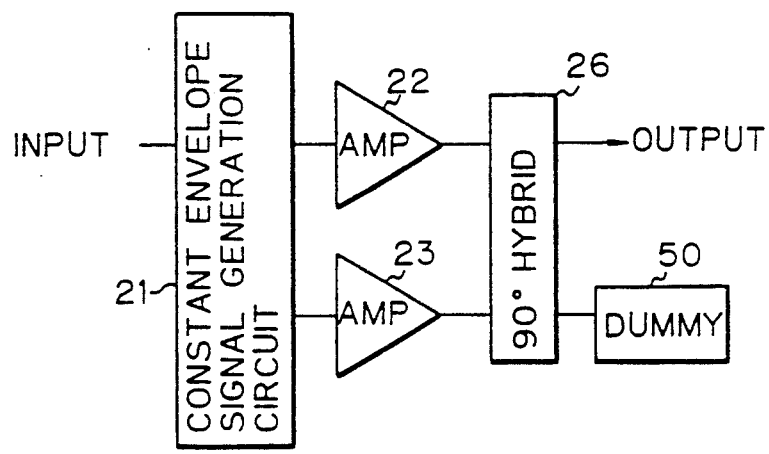
FIG. 2 is a diagram of a construction of the LINC system.

The constant envelope signal generation circuit 21 is the same as that used in the conventional LINC system. When an input electric signal (a high frequency signal having the wavelength λ) is input into the constant envelope signal generation circuit 21, the constant envelope signal generation circuit 21 transforms the electric signal to form first and second constant envelope signals where amplitudes of envelopes of the first and second constant envelope signals are equal and constant, and the phases of the first and second constant envelope signals respectively differ by positive and negative amounts from the phase of the input electric signals shown in FIG. 1B. In the constant envelope signal generation circuit 21, these constant envelope signals are generated by dividing the input electric signal into two signals each having an equal amplitude and positive and negative phase difference from that of the original input electric signal, and respectively adding first and second additional signal components to the two divided signals to generate the first and second constant envelope signals. The amplifying circuits 22 and 23 respectively amplify the first and second constant envelope signals. The strip lines 24 and 25 constitute a branch line. The outputs of the amplifying circuits 22 and 23 respectively pass through the strip lines 24 and 25, and are then summed at a connection point α of the strip lines 24 and 25. The lengths of the strip lines 24 and 25 are equal to $(2n-1)\lambda/4$ where $n=1, 2, \ldots$, and in particular, in the construction of FIG. 4, the lengths are equal to $\lambda/4$.

Signal components in the amplified constant envelope signals which components result from the above additional signal components, are not included in the above sum, and these signal components are reflected toward the amplifying circuits 22 and 23. Therefore, currents which flow in the amplifying circuits 22 and 23 do not include the above components. When each of the amplifying circuits 22 and 23 is either of a class "AB" amplifier, a class "B" amplifier, a class "C" amplifier, or a class "F" amplifier, the current which flows through the amplifying circuit varies depending upon an output power thereof, and therefore, the total efficiency of the high frequency amplifier is improved, compared with the conventional LINC system, when the input power is low.

Figure 5:
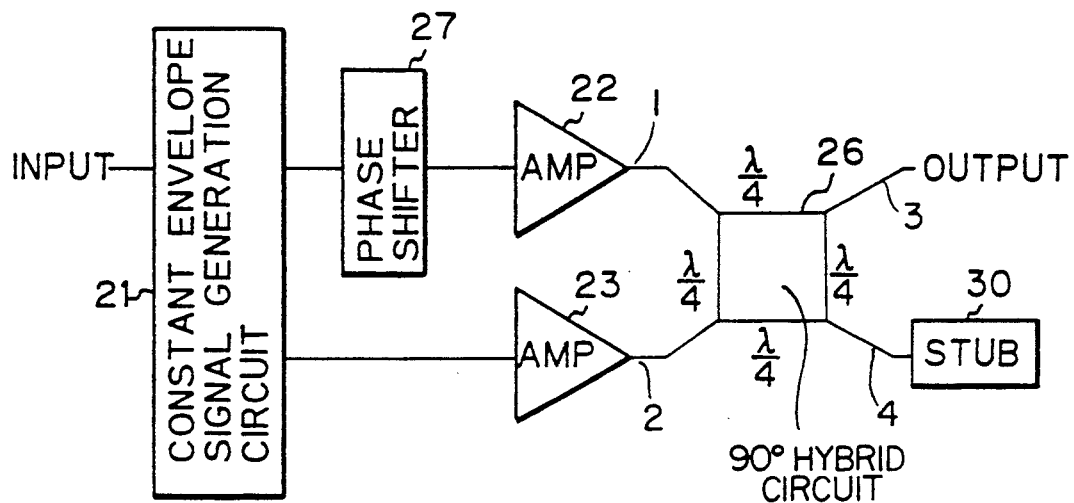
FIG. 5 is a diagram indicating a construction of a high frequency amplifier according to the second embodiment of the present invention.

FIG. 5 (Second Embodiment)

FIG. 5 is a diagram indicating a construction of a high frequency amplifier according to the second embodiment of the present invention. In FIG. 5, reference numeral 21 denotes a constant envelope signal generation circuit, 22 and 23 each denote an amplifying circuit, 26 denotes a 90° hybrid circuit, 27 denotes a phase shift circuit, and 30 denotes a stub.

The constant envelope signal generation circuit 21, and the amplifying circuits 22 and 23 are the same as that of the first embodiment.

One of the first and second constant envelope signals which are generated in the constant envelope signal generation circuit 21 is input in the phase shift circuit 27, and the phase of one of the first and second constant envelope signals is shifted by 90° in the phase shift circuit 27. The other of the first and second constant envelope signals and the above output of the phase shift circuit 27 are respectively input into the amplifying circuits 22 and 23. The 90° hybrid circuit 26 in FIG. 5 is a branch-line type hybrid circuit, which is comprised of strip lines forming a square, and a length of each side of the square is equal to $\lambda/4$, where $\lambda$ is a wavelength of the carrier of the input electric signal. The 90° hybrid circuit 26 has first, second, third, and fourth terminals (which are respectively denoted by 1, 2, 3, and 4) at four corners of the square, respectively. The output terminals of the amplifying circuits 22 and 23 are respectively connected to the first and second terminals 1 and 2 of the 90° hybrid circuit 26, where the first and second terminals locate at both ends of one side of the square. Since the phase of the amplified constant envelope signal which is input into the first terminal 1 is shifted by 90° in the phase shift circuit 27, the phase of the amplified constant envelope signal which is input into the second terminal 2 is not shifted, the propagation length from the first terminal 1 to the third terminal 3 is $\lambda/4$, and the propagation length from the second terminal 2 to the third terminal 3 is $\lambda/2$, signal components in phase in the amplified constant envelope signals from the amplifying circuits 22 and 23 are summed at the third terminal 3. The signal components out of phase in the amplified constant envelope signals which components result from the above additional signal components (as explained for the first embodiment), are not included in the above sum, and these signal components are output from the fourth terminal 4. The stub 30 is connected to the fourth terminal 4, and the above signal components out of phase are reflected at the end of the stub 30 toward the amplifying circuits 22 and 23.

Figure 6:
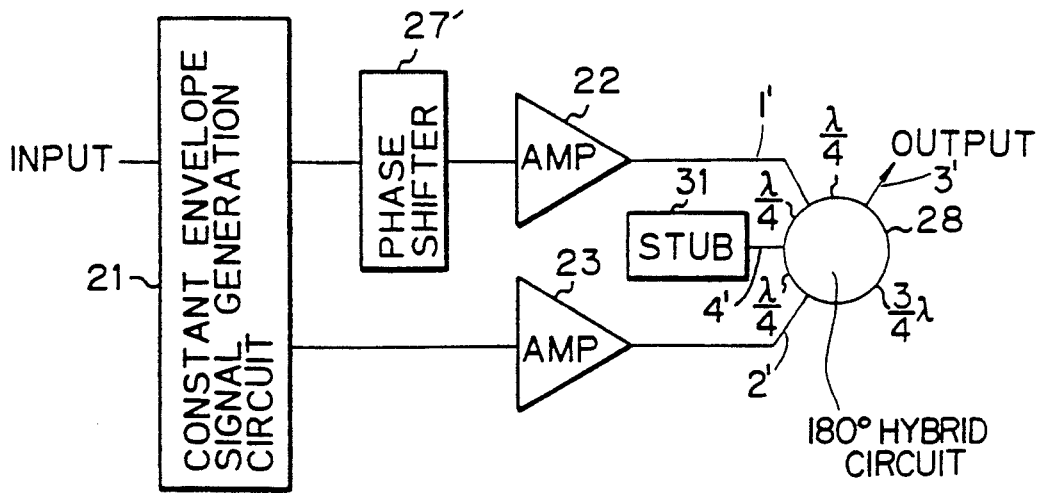
FIG. 6 is a diagram indicating a construction of a high frequency amplifier according to the third embodiment of the present invention.

FIG. 6 (Third Embodiment)

FIG. 6 is a diagram indicating a construction of a high frequency amplifier according to the third embodiment of the present invention. In FIG. 6, reference numeral 21 denotes a constant envelope signal generation circuit, 22 and 23 each denote an amplifying circuit, 28 denotes a 180° hybrid circuit, 27, denotes a phase shift circuit, and 31 denotes a stub.

In the construction of FIG. 6, the constant envelope signal generation circuit 21, the amplifying circuits 22 and 23, and the stub 31 respectively operate in the same way as the corresponding elements in the construction of the second embodiment. The phase shift circuit 27' in FIG. 6 shifts the phase of one of the constant envelope signals which are generated in the constant envelope signal generation circuit 21, by 180°, to input the phase shifted constant envelope signal to one of the amplifying circuits 22 and 23. The 180° hybrid circuit 28 in FIG. 6 is a rat-race circuit, which comprises a strip line formed in a ring shape, and first, second, third, and fourth terminals (which are respectively denoted by 1', 2', 3', and 4'). The third, first, fourth, and second terminals are provided on the ring with an interval of $\lambda/4$ as shown in FIG. 6. The output of the phase shift circuit 27' is input into the first terminal 1' of the rat-race circuit 28 through the amplifying circuit 22. The amplifying circuit 23 amplifies the other constant envelope signal to input the amplified constant envelope signal into the second terminal 2' of the rat-race circuit 28. Since the phase of the amplified constant envelope signal which is input into the first terminal 1' is shifted by 180° in the phase shift circuit 27', the phase of the amplified constant envelope signal which is input into the second terminal 2' is not shifted, the propagation length from the first terminal 1' to the third terminal 3' is $\lambda/4$, and the propagation length from the second terminal 2' to the third terminal 3' is $3\lambda/4$, signal components in phase in the amplified constant envelope signals from the amplifying circuits 22 and 23 are summed at the third terminal 3'. The signal components out of phase in the amplified constant envelope signals, which components result from the above additional signal components (as explained for the first embodiment), are not included in the above sum, and these signal components are output from the fourth terminal 4'. The stub 31 is connected to the fourth terminal 4', and the above signal components out of phase are reflected at the end of the stub 31 toward the amplifying circuits 22 and 23.

Theoretical Consideration (FIG. 4)

The improvement of the efficiency in the constructions according to the present invention, is theoretically considered below. Although the following consideration is made for the first embodiment with reference to FIG. 4, a similar consideration can be applied to the second and third embodiments of the present invention.

First, assume that the first and second constant envelope signals which are generated in the constant envelope signal generation circuit 21 are expressed as $B = \exp[+j(\omega t + \theta)]$ and $C = \exp[-j(\omega t - \theta)]$, where the phase $\theta$ in the constant envelope signals corresponds to the amplitude of the input electric signal.

The S parameter of the branch circuit which is comprised of the strip lines 24 and 25 and the connection point $\alpha$, and which has three ports PORT0, PORT1, and PORT2, is expressed as $$\begin{pmatrix} S_{00} & S_{01} & S_{02} \\ S_{10} & S_{11} & S_{12} \\ S_{20} & S_{21} & S_{22} \end{pmatrix} = \begin{pmatrix} 0 & -j/2^{0.5} & -j/2^{0.5} \\ -j/2^{0.5} & 0.5 & -0.5 \\ -j/2^{0.5} & -0.5 & 0.5 \end{pmatrix}.$$

Generally, when signals are input into n ports other than a 0-th port in a circuit having $n+1$ ports, and an impedance-matching load is connected to the 0-th port, a reflection coefficient $S_{ii}'$ at the i-th port is expressed as $$S_{ii}' = \frac{1}{a_i} \sum_{k=1}^{h} a_k S_{ki}.$$

Therefore, the reflection coefficients $S_{11}'$ and $S_{22}'$ at the ports PORT1 and PORT2 in FIG. 4 when the above two waves B and C are input into the above branch strip line are respectively indicated as $$\begin{aligned} S_{11}' &= S_{11} + \exp^{(+2j\theta)} S_{12} \\ &= 0.5(1 - \exp^{(+2j\theta)}), \end{aligned}$$

and $$\begin{aligned} S_{22}' &= S_{22} + \exp^{(-2j\theta)} S_{21} \\ &= 0.5(1 - \exp^{(-2j\theta)}). \end{aligned}$$

Therefore, the reflection coefficient $S_{22}'$ is a complex conjugate number of $S_{11}'$.

The normalized impedance Z is obtained from the above equations, as shown below.

$$Z = 1 \pm j \frac{2\sin 2\theta}{1 + \cos 2\theta}.$$

Since, on the other hand, an outgoing wave $b_0$ from the port PORT0 (the output terminal of the construction of FIG. 4) is expressed as $$\begin{aligned} b_0 &= \sum_{k=1}^{h} a_k S_{0k}, \\ b_0 &= a_1 S_{01} + a_2 S_{02} \\ &= -j/2^{0.5} \cos\theta. \end{aligned}$$

Thus, the components in phase in the above wave B from the port PORT1 and C from the port PORT2 are synthesized at the port PORT0 to generate the component corresponding to the original input electric signal, and the components out of phase in the waves B and C are not output from the port PORT0.

The above components out of phase, which are to be eliminated, are reflected, and therefore, the load impedances of the amplifying circuits 22 and 23 vary depending on $\theta$.

Since, however, a real part of an equivalent normalized impedance of each amplifying circuit is constantly equal to one, and only an imaginary part thereof varies, a load characteristic curve deviates from a straight line with an increase in the value of $\theta$. Thus, a reactive power is generated, and the efficiency becomes proportional to a square root of an output power. This relationship between the efficiency and the output power is the same as those in the class "B" and class "F" amplifiers. Namely, the efficiency is higher than that of the LINC system. Since the maximum linear efficiencies of the class "B" and class "F" amplifiers are $(\pi/4) \times 100\% (= 78.5\%)$, the maximum linear efficiency is remarkably improved when compared with the LINC system, but the characteristic of the efficiency is the same as that of the conventional amplifiers. For example, the efficiency of the construction of FIG. 4 using the branch strip line is lowered by 25% responding to a 6 dB back-off, and the efficiency of the construction of FIG. 5 using the hybrid circuit is lowered by 50% responding to the 6 dB back-off. The efficiency can be further improved in the fourth and fifth embodiments which are explained with reference to FIGS. 7 and 9.

Figure 7:
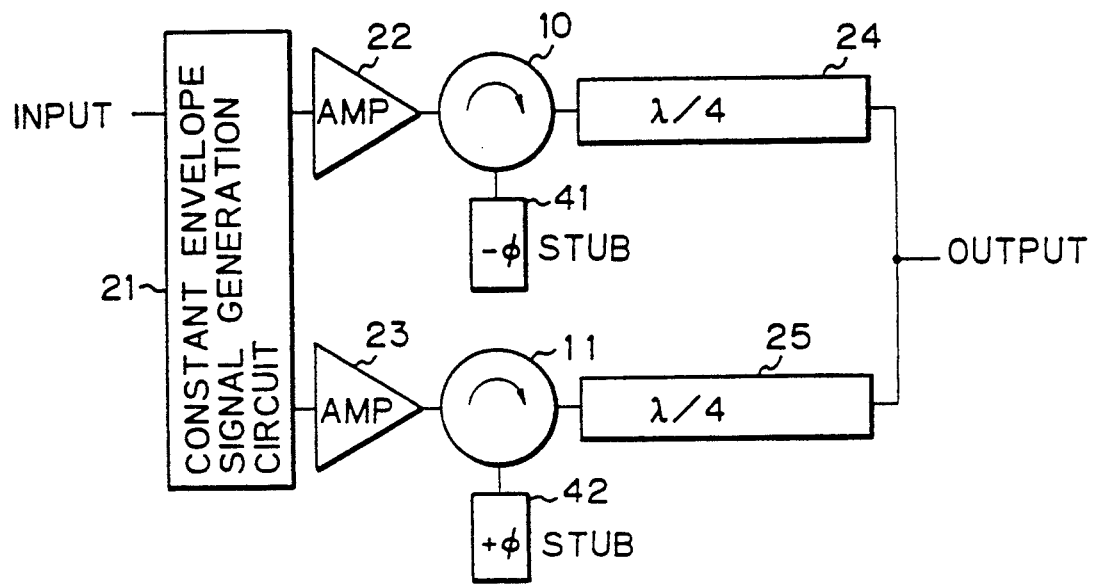
FIG. 7 is a diagram indicating a construction of a high frequency amplifier according to the fourth embodiment of the present invention.
Figure 8:
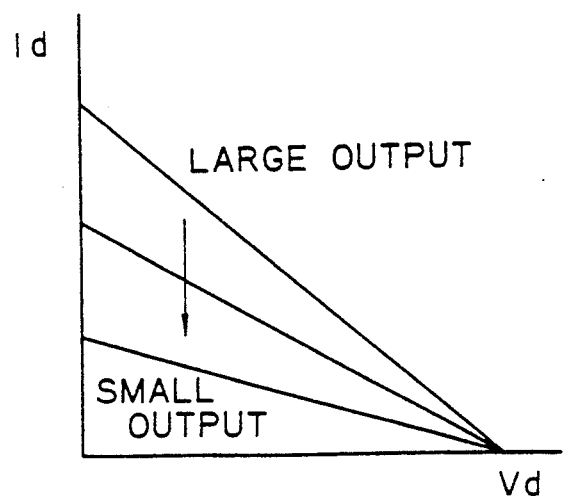
FIG. 8 is a diagram indicating load characteristic curves of an amplification device in each of the first and second amplifying circuits.

FIGS. 7, and 8 (Fourth Embodiment)

FIG. 7 is a diagram indicating a construction of a high frequency amplifier according to the fourth embodiment of the present invention. In FIG. 7, reference numeral 21 denotes a constant envelope signal generation circuit, 22 and 23 each denote an amplifying circuit, 10 and 11 each denote a circulator, 24 and 25 each denote a strip line, and 41 and 42 each denote a stub.

In the construction of FIG. 7, the constant envelope signal generation circuit 21, and the amplifying circuits 22 and 23, respectively operate in the same way as the corresponding elements in the construction of the first embodiment. The lengths of the strip lines 24 and 25 are equal to $(2n-1)\lambda/4$ where $n = 1, 2, \ldots$, and in particular, in the construction of FIG. 7, the lengths are equal to $\lambda/4$.

Two constant envelope signals which are obtained in the constant envelope signal generation circuit 21 as explained with reference to FIG. 7, are respectively amplified in the amplifying circuits 22 and 23, respectively pass through the circulators 10 and 11, and are then respectively input into the strip lines 24 and 25. Then, components in phase in the waves which propagate to the output terminals of the strip lines 24 and 25 are synthesized to generate an amplified signal of the input electric signal at the connection point of the strip lines 24 and 25. The remaining components which are out of phase in the waves which propagate to the output terminals of the strip lines 24 and 25 are reflected through the strip lines 24 and 25 toward the second terminals of the first and second circulators 10 and 11, respectively. The reflected waves are respectively input into the circulators 10 and 11, and the phases of the reflected waves are respectively shifted by the stubs 41 and 48, and thereby, the real parts of the load impedances of the amplifying circuits 22 and 23 are respectively changed as explained below.

When it is assumed that the phase shifts which are caused on the above reflected waves by the stubs 41 and 42 are respectively, $-\phi$ and $+\phi$, the two constant envelope signals generated in the constant envelope signal generation circuit 21 are expressed as ,, $$B = exp[+j(\omega t + \theta)] \text{ and}$$

$$C = exp[-j(\omega t - \theta)], \text{ and}$$

the S parameter of the branch line including the circulators 10 and 11 is expressed as $$\begin{pmatrix} S_{00} & S_{01} & S_{02} \\ S_{10} & S_{11} & S_{12} \\ S_{20} & S_{21} & S_{22} \end{pmatrix},$$

$$\begin{pmatrix} S_{00} \\ S_{10} \\ S_{20} \end{pmatrix} = \begin{pmatrix} 0 \\ 2^{-0.5} exp(j\alpha) \\ 2^{-0.5} exp(-j\alpha) \end{pmatrix}$$

$$\begin{pmatrix} S_{01} \\ S_{11} \\ S_{21} \end{pmatrix} = \begin{pmatrix} -j2^{-0.5} \\ 0.5 exp(2j\phi) \\ 0.5 exp(-j\beta) \end{pmatrix}$$

$$\begin{pmatrix} S_{02} \\ S_{12} \\ S_{22} \end{pmatrix} = \begin{pmatrix} -j2^{-0.5} \\ 0.5 exp(j\beta) \\ 0.5 exp(-2j\phi) \end{pmatrix},$$

where $\alpha = 2\phi - \phi/2$ and $\beta = 2\phi - \pi$.

Similar to the first embodiment, components in phase in the waves B and C are completely synthesized to generate an amplified signal of the input electric signal at the connection point of the strip lines 24 and 25.

Therefore, the reflection coefficients S11' and S22' at the ports PORT1 and PORT2 when the above two waves B and C are input into the above branch strip line, are respectively indicated as $$\begin{aligned} S_{11}' &= S_{11} + exp^{(-j\theta)} S_{12} \\ &= 0.5 exp^{(2j\phi)}(1 - exp^{(-2j\theta)}), \end{aligned}$$

and $$\begin{aligned} S_{22}' &= S_{22} + exp^{(+j\theta)} S_{21} \\ &= 0.5 exp^{(-2j\phi)}(1 - exp^{(2j\theta)}). \end{aligned}$$

The above reflection coefficient S11' corresponds to an expression which is obtained by rotating the aforementioned reflection coefficient S11' in the construction of FIG. 4 by $2\phi$, and the above reflection coefficient S22' corresponds to an expression which is obtained by rotating the aforementioned reflection coefficient S22' in the construction of FIG. 4 by $-2\phi$.

Figure 3:
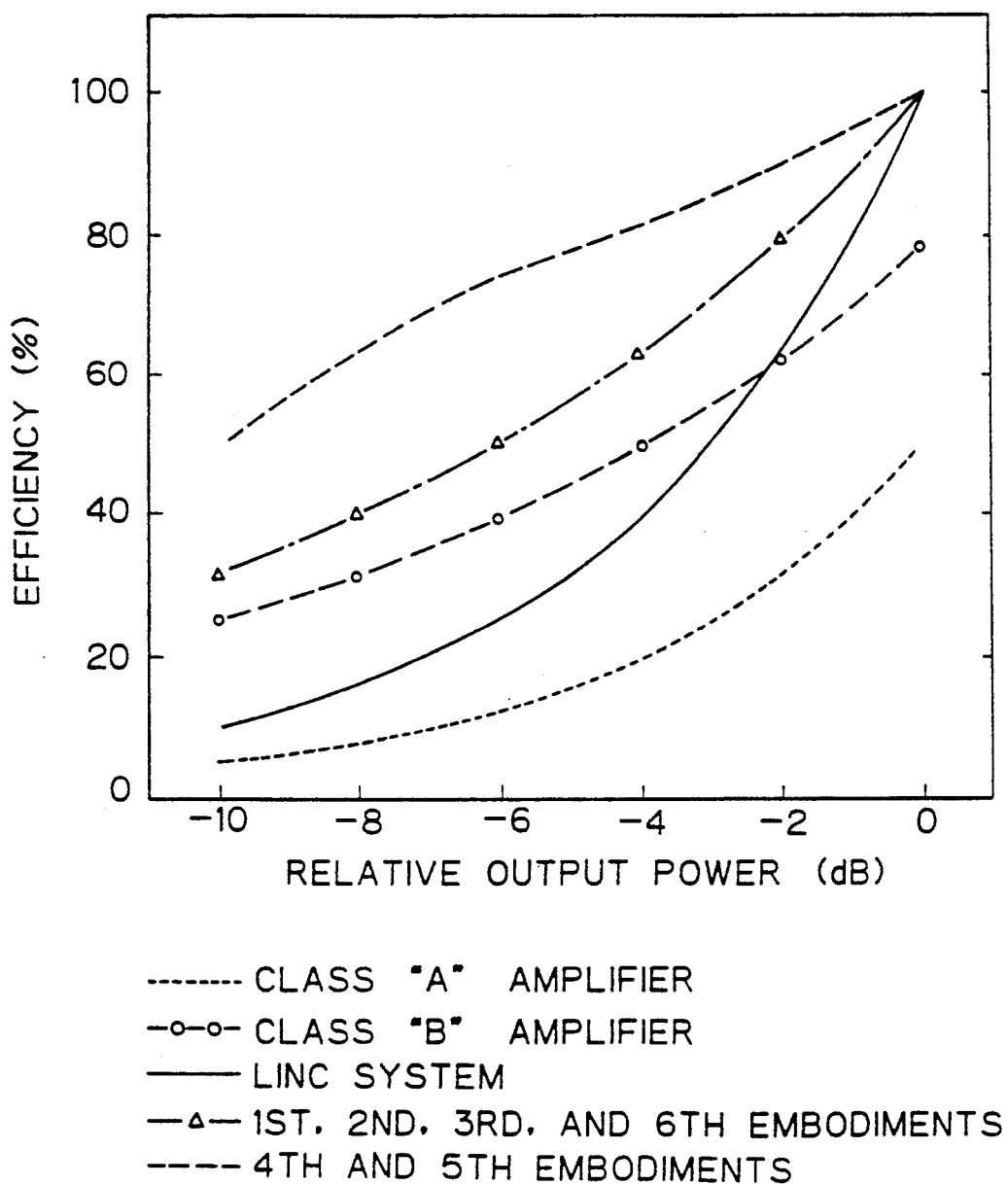
FIG. 3 is a diagram showing efficiencies of an ideal class "A" amplifier, ideal class "B" amplifier, the LINC system containing amplifiers of 100% efficiencies, and constructions of various aspects of the present invention for various values of relative output power.

In addition, the above reflection coefficients S11' and S22' become a real number when $\theta = 0$ and $\theta = 2\phi \pm \pi/2$. Therefore, load impedances corresponding to the above reflection coefficients Sii' become a real number when $\theta = 2\phi \pm \pi/2$ making the respective propagation lengths from the output port PORT0 to the respective amplification devices different from the corresponding propagation lengths from amplification devices in the amplifying circuits to the output port PORT0. Since the reactive power becomes zero at the points where the load impedances are a real number, the total efficiency is improved as shown in FIG. 3.

Further, when a controllable (variable) phase shift circuit is connected to each circulator instead of the stub 41 or 42 in the construction of FIG. 7, and the adaptively varying amounts of the phase shifts which are given to the reflecting waves responding to the phase $\theta$ where the phase $\theta$ corresponds to the amplitude of the input electric signal, the real parts of the load impedances can be adaptively varied. Since, for example, at the conditions where $\theta = 2\phi \pm \pi/2$, the real parts of the reflection coefficients S11' and S22' at the ports PORT1 and PORT2 become equal to $-\sin\theta$, the load impedance of each of the amplifying circuits can be maintained as a real number for an arbitrary level of the input electric signal, and the real parts of the load impedances can be adaptively varied. In the above condition, the real parts of the load impedances of the amplifying circuits 22 and 23 become large when the output power of the high frequency amplifier is large (i.e., the level of the input electric signal is high), and become small when the output power of the high frequency amplifier is small (i.e., the level of the input electric signal is low). The reactive power can be eliminated by varying the real parts of the load impedances responding to the output power so that the load impedances become small when the output power of the high frequency amplifier is large (i.e., the level of the input electric signal is high), and become large when the output power of the high frequency amplifier is small (i.e., the level of the input electric signal is low). FIG. 8 is a diagram indicating load characteristic curves of an amplification device in each of the amplifying circuits 22 and 23 when the load impedances are controlled as above.

Figure 9:
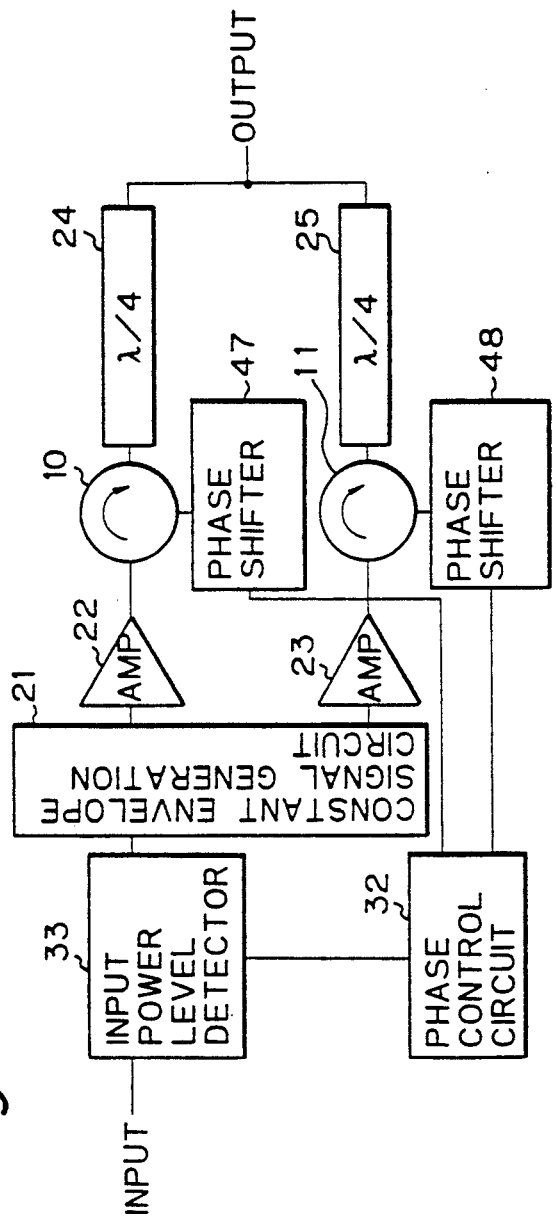
FIG. 9 is a diagram indicating a construction of a high frequency amplifier according to the fifth embodiment of the present invention.

FIG. 9 (Fifth Embodiment)

The above adaptive control of the load impedances is realized by the fifth embodiment of the present invention. FIG. 9 is a diagram indicating a construction of a high frequency amplifier according to the fifth embodiment of the present invention. In FIG. 9, reference numeral 21 denotes a constant envelope signal generation circuit, 22 and 23 each denote an amplifying circuit, 10 and 11 each denote a circulator, 24 and 25 each denote a strip line, 32 denotes a phase control circuit, 33 denotes an input level detection circuit, and 47 and 48 each denote a variable phase shift circuit.

In the construction of FIG. 9, the elements except the variable phase shift circuits 47 and 48, the phase control circuit 33, and the phase control circuit 32, respectively operate in the same way as the corresponding elements in the constructions of the fourth embodiment.

The input level detection circuit 33 detects the input power level of the input electric signal. The detected result is supplied to the phase control circuit 32, and the phase control circuit 32 controls the amounts of the phase shifts which are given to the respective reflected waves from the strip lines 24 and 25 in the variable phase shift circuits 47 and 48. The control is carried out so that the load impedance of each of the amplifying circuits 22 and 23 are maintained to be a real number for an arbitrary input power level, i.e., for an arbitrary value of $\theta$, as explained before. Thus, the load characteristic curves in the amplification devices in the amplifying circuits do not deviate from straight lines as shown in FIG. 8, and therefore, the reactive power is

Figure 10:
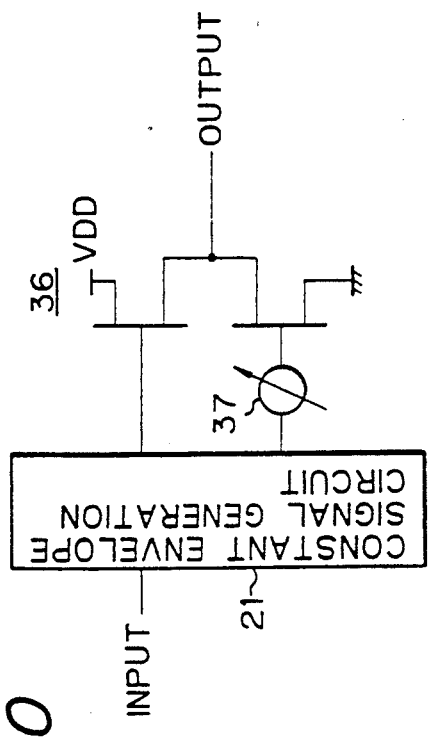
FIG. 10 is a diagram indicating a construction of a high frequency amplifier according to the sixth embodiment of the present invention.

FIG. 10 (Sixth Embodiment)

FIG. 10 is a diagram indicating a construction of a high frequency amplifier according to the sixth embodiment of the present invention. In FIG. 10, reference numeral 21 denotes a constant envelope signal generation circuit, 36 denotes a shift register, and 37 denotes a phase inversion circuit.

The constant envelope signal generation circuit 21 operates in the same way as those in the constructions of the first to fifth embodiments. The phase inversion circuit 37 inverts the phase of one of the output of the constant envelope signal generation circuit 21. The single-ended push-pull amplifier circuit 36 comprises two amplification devices (for example, FET's) which are serially connected to each other as shown in FIG. 10, two input terminals, and one output terminal. The other of the two outputs of the constant envelope signal generation circuit 21 and the output of the phase inversion circuit 37 are input from the two input terminals of the single-ended push-pull amplifier circuit 36, and the single-ended push-pull amplifier circuit 36 outputs an amplified signal of the input electric signal of the high frequency amplifier of FIG. 10.

The phase of one of the two constant envelope signals from the constant envelope signal generation circuit 21 is inverted by the phase inversion circuit 37, and the phase-inverted constant envelope signal is then input into one of the input terminals of the constant envelope signal generation circuit 36, and the other constant envelope signal from the constant envelope signal generation circuit 21 is directly input into the other input terminal of the single-ended push-pull amplifier circuit 36. The signal component which is input from one of the input terminals (hereinafter called first input terminal) of the single-ended push-pull amplifier circuit 36 suffers from a phase inversion when the signal component is amplified by one of the amplification devices (hereinafter called first amplification device) in the single-ended push-pull amplifier circuit 36, and the signal component which is input from the other of the input terminals (hereinafter called second input terminal) of the single-ended push-pull amplifier circuit 36 does not suffer from a phase inversion when the signal component is amplified by the other of the amplification devices (hereinafter called second amplification device) in the single-ended push-pull amplifier circuit 36. Therefore, when the output of the phase inversion circuit 37 is input into the above first input terminal of the single-ended push-pull amplifier circuit 36, and the above other constant envelope signal is directly input into the above second input terminal of the single-ended push-pull amplifier circuit 36, the outputs of both the amplification devices in the single-ended push-pull amplifier circuit 36 are in phase. Thus, signal components in phase in the two constant envelope signals generated in the constant envelope signal generation circuit 21 are synthesized at a point (output terminal of the high frequency amplifier) at which the output terminals of both the amplification devices are connected. Namely, the amplified signal of the input electric signal of the high frequency amplifier is obtained at the point.

The above amplification devices may be one of a class "AB" amplifier, a class "B" amplifier, and a class "C" amplifier, wherein an input current thereof varies depending upon an input power thereof.

Since no reactive power is generated in the above construction of FIG. 10, a highly efficient amplification of the input electric signal can be achieved.

The efficiencies of the above constructions of various embodiments of the present invention are indicated for various values of relative output power, compared with those of an ideal class "A" amplifier, an ideal class "B" amplifier, and the LINC system containing amplifiers of 100% efficiencies. As shown in FIG. 3, efficiencies in the embodiments of the present invention are remarkably improved compared with those of an ideal class "A" amplifier, an ideal class "B" amplifier, and the LINC system.

We claim:

1. A high frequency amplifier, comprising:
   a constant envelope signal generation circuit for receiving an input electric signal and transforming the electric signal to form first and second constant envelope signals having constant envelope amplitudes and having phases corresponding to an amplitude of an envelope of the input electric signal;
   phase shift means for shifting a phase of said first constant envelope signal by 90 degrees;
   a first amplifying circuit, operatively connected to said phase shift means, for receiving and amplifying said first constant envelope signal after the phase of the first constant envelope signal has been shifted by 90 degrees, to generate a first amplified signal;
   a second amplifying circuit, operatively connected to said constant envelope signal generation circuit, for receiving and amplifying said second constant envelope signal, to generate a second amplified signal; and
   a 90° hybrid circuit, having first, second, third, and fourth terminals, for receiving said first and second amplified signals from said first and second amplifying circuits, at said first and second terminals, respectively, and for synthesizing said first and second amplified signals to generate an amplified signal of said input electric signal, a propagation length of a first signal path from said second terminal to said third terminal and a propagation length of a second signal path from said second terminal to said third terminals producing a sum of said phase shift caused by said phase shift means and the first signal path from said first terminal to said third terminal equal to a phase shift caused by the second signal path from said second terminal to said third terminal, said amplified signal of said input electric signal being output from said third terminal, and said fourth terminal being made electrically open.

2. A high frequency amplifier according to claim 1, wherein each of said first and second amplifying circuits is one of a class "AB" amplifier, a class "B" amplifier, a class "C" amplifier, and a class "F" amplifier, having a current which flows therethrough varying in dependence upon an output power thereof.

3. A high frequency amplifier, comprising:
   a constant envelope signal generation circuit for receiving an input electric signal and transforming the electric signal to form first and second constant envelope signals having constant envelope amplitudes and having phases corresponding to an amplitude of an envelope of the input electric signal;
   phase shift means for shifting a phase of said first constant envelope signal by 180 degrees;
   a first amplifying circuit, operatively connected to said phase shift means, for receiving and amplifying said first constant envelope signal after the phase of the first constant envelope signal after the phase of the first constant envelope signal has been shifted by 180 degrees, to generate a first amplified signal;

a second amplifying circuit, operatively connected to said constant signal generation circuit, for receiving and amplifying said second constant envelope signal, to generate a second amplified signal; and a 180° hybrid circuit, having first, second, third, and fourth terminals, for receiving said first and second amplified signals from said first and second amplifying circuits at said first and second terminals, respectively, and for synthesizing said first and second amplified signals to generate an amplified signal of said input electric signal, a propagation length of a first signal path from said second terminal to said third terminal and a propagation length of a second signal path from said first terminal to said third terminal producing a sum of said phase shift caused by said phase shift means and the first signal path from said first terminal equal to a phase shift caused by the second signal path from said second terminal to said third terminal, said amplified signal of said input electric signal being output from said third terminal, and said fourth terminal being made electrically open.

4. A high frequency amplifier according to claim 3, wherein each of said first and second amplifying circuits is one of a class "AB" amplifier, a class "B" amplifier, a class "C" amplifier, and a class "F" amplifier, having a current which flows therethrough varying in dependence upon an output power thereof.

5. A high frequency amplifier, comprising:
a constant envelope signal generation circuit for receiving an input electric signal and transforming the input electric signal to form two constant envelope signals having constant envelope amplitudes and having phases corresponding to an amplitude of an envelope of the input electric signal;

first and second amplifying circuits for respectively receiving the constant envelope signals and separately amplifying the constant envelope signal to respectively generate first and second amplified signals at output terminals thereof;

a first circulator having first, second, and third terminals, said first terminal operatively connected to the output terminal of said first amplifying circuit;

a second circulator having first, second, and third terminals, said first terminal operatively connected to the output terminal of said second amplifying circuit, in each of said first and second circulators, an input signal from said first terminal being output from said second terminal, an input signal from said second terminal being output from said third terminal, and an input signal from said third terminal being output from said first material;

power synthesizing circuit means for receiving said first and second amplified signals from said second terminals of said first and second circulators, for synthesizing the first and second amplified signals to generate a third amplified signal corresponding to said input electric signal, and reflecting remaining components of said first and second amplified signals toward said second terminal of each of said first and second circulators, a propagation length of an electric signal from the terminals of each of said first and second circulators to said output terminal of said power synthesizing circuit means being equal to $(2n-1)\lambda/4$, where $n = 1, 2, \ldots$, and $2\pi/\lambda$ is an amplification frequency;

first phase shift means operatively connected to said third terminal of said first circulator, for receiving an electric signal output from the third terminal of said first circulator, shifting a phase of the received electric signal, and for outputting a first phase-shifted signal to the third terminal of said first circulator; and second phase shift means, operatively connected to said third terminal of said second circulator, for receiving an electric signal output from the third terminal of said second circulator, for shifting a phase of the electric signal, and for outputting a second phase-shifted signal to the third terminal of said second circulator.

6. A high frequency amplifier according to claim 5, wherein the phase shifts in said first and second phase shift means have equal absolute values and the polarities of the phase shifts in said first and second phase shift means are opposite to one another.

7. A high frequency amplifier, comprising:
a constant envelope signal generation circuit for receiving an input electric signal and transforming the input electric signal to form two constant envelope signals having constant envelope amplitudes and having phases corresponding to an amplitude of an envelope of the input electric signal;

first and second amplifying circuits for respectively receiving the constant envelope signals and separately amplifying the constant envelope signals to respectively generate first and second amplified signals at output terminals thereof; and power synthesizing circuit means for receiving said first and second amplified signals and for synthesizing the first and second amplified signals to generate a third amplified signal corresponding to the input electric signal, said power synthesizing circuit means comprising means for adaptively varying a real part of an input impedance of said power synthesizing circuit means in dependence upon an amplitude of an envelope of said input electric signal so that the real part of the input impedance of the power synthesizing circuit means becomes large when an output power of the power synthesizing circuit means is small, and the real part of the input impedance of the power synthesizing circuit means becomes small when an output power is large.

8. A high frequency amplifier according to claim 7, wherein said power synthesizing circuit means comprises:
input power level detecting means for detecting a power level of said input electric signal;

a first circulator having first, second, and third terminals, said first terminal operatively connected to the output terminal of said first amplifying circuit;

a second circulator having first, second, and third terminals, said first terminal operatively connected to the output terminal of said second amplifying circuit, in each of said first and second circulators, an input signal from said first terminal being output from said second terminals, an input signal from said second terminal being output from said third terminal, and an input signal from said third terminal being output from said first terminal;

a branch circuit, having an output terminal, for receiving said first and second amplified signals from said second terminals of said first and second circulators, for synthesizing the first and second amplified signals to generate a third amplified signal corresponding said input electric signal, and for reflecting remaining components of said first and second amplified signals after said synthesizing operation toward said second terminals of said first and second circulators, a propagation length of an electric signal from the terminals of each of said first and second circulators to said output terminal of said branch circuit being equal to $(2n-1)\lambda/4$, where $n=1, 2, \ldots$, and $2\pi/\lambda$ is an amplification frequency;

first phase shift means operatively connected to said third terminal of said first circulator, for receiving an electric signal output from the third terminal of said first circulator, for shifting a phase of the received electric signal, and for outputting a first phase-shifted signal to the third terminal of said first circulator; and second phase shift means operatively connected to said third terminal of said second circulator, for receiving an electric signal output from the third terminal, for shifting a phase of the electric signal, and for outputting a second phase-shifted signal to the third terminal;

said branch circuit comprising means for adaptively varying a real part of an input impedance of said power synthesizing circuit in dependence upon the power level detected by said input power level detecting means to maintain the real part of the input impedance of the power synthesizing circuit means equal to zero.

9. A high frequency amplifier, comprising:

a constant envelope signal generation circuit for receiving an input electric signal and transforming the electric signal to form two constant envelope signals having constant envelope amplitudes and having phases of the constant envelope signals corresponding to an amplitude of an envelope of the input electric signal;

phase inversion means for inverting a phase of one of said two constant envelope signals; and a single-ended push-pull amplifier circuit for receiving the other of said two constant envelope signals and an output of said phase inversion means, and synthesizing the received signals to generate an amplified signal of said input electric signal.

10. A high frequency amplifier according to claim 9, wherein said single-ended push-pull amplifier circuit comprises serially connected first and second amplifying devices, and wherein each of said first and second amplifying devices is one of a class "AB" amplifier, a class "B" amplifier, and a class "C" amplifier, wherein a current which flow therethrough varying in dependence upon an input power thereof.

* * * * *